US008286060B2

(12) United States Patent
Panteleev et al.

(10) Patent No.: US 8,286,060 B2
(45) Date of Patent: Oct. 9, 2012

(54) SCHEME FOR ERASURE LOCATOR POLYNOMIAL CALCULATION IN ERROR-AND-ERASURE DECODER

(75) Inventors: Pavel A. Panteleev, Moscow (RU); Elyar E. Gasanov, Moscow (RU); Alexander Andreev, San Jose, CA (US); Ilya V. Neznanov, Moscow (RU); Pavel A. Aliseychik, Moscow (RU)

(73) Assignee: LSI Corporation, Milpitas, CA (US)

( * ) Notice: Subject to any disclaimer, the term of this patent is extended or adjusted under 35 U.S.C. 154(b) by 1105 days.

(21) Appl. No.: 12/182,443

(22) Filed: Jul. 30, 2008

(65) Prior Publication Data

US 2010/0031127 A1 Feb. 4, 2010

(51) Int. Cl.
*G06F 11/00* (2006.01)

(52) U.S. Cl. .................. 714/781; 714/784; 714/785

(58) Field of Classification Search .................. None
See application file for complete search history.

(56) References Cited

U.S. PATENT DOCUMENTS

| | | | | | |
|---|---|---|---|---|---|
| 4,845,713 | A | * | 7/1989 | Zook | 714/784 |
| 5,715,262 | A | * | 2/1998 | Gupta | 714/784 |
| 5,771,244 | A | * | 6/1998 | Reed et al. | 714/752 |
| 6,047,395 | A | * | 4/2000 | Zook | 714/756 |
| 7,353,449 | B2 | * | 4/2008 | Muller et al. | 714/785 |
| 7,793,196 | B2 | * | 9/2010 | Jiang et al. | 714/784 |
| 2003/0126544 | A1 | * | 7/2003 | Dadurian | 714/785 |
| 2003/0131308 | A1 | * | 7/2003 | Lee et al. | 714/781 |
| 2005/0166126 | A1 | * | 7/2005 | Muller et al. | 714/784 |
| 2005/0172208 | A1 | * | 8/2005 | Yoon | 714/784 |
| 2005/0278610 | A1 | * | 12/2005 | Banks | 714/784 |
| 2006/0174181 | A1 | * | 8/2006 | Banks et al. | 714/784 |
| 2007/0136646 | A1 | * | 6/2007 | Ono | 714/785 |
| 2008/0065966 | A1 | * | 3/2008 | Jiang et al. | 714/781 |
| 2010/0281344 | A1 | * | 11/2010 | Gasanov et al. | 714/784 |

* cited by examiner

*Primary Examiner* — Christopher McCarthy
(74) *Attorney, Agent, or Firm* — Christopher P. Maiorana, PC

(57) ABSTRACT

A method to generate an erasure locator polynomial in an error-and-erasure decode. The method generally includes the steps of (A) storing current values in multiple registers at a current moment, (B) generating first values by multiplying each current value by a respective one of multiple constants, (C) generating second values by gating at least all but one of the first values with a current one of multiple erasure values of an erasure position vector, (D) generating next values by combining each one of the second values with a corresponding one of the first values, (E) loading the next values into the registers in place of the current values at a next moment and (F) generating an output signal carrying the current values at a last moment such that the current values form the coefficients of the erasure locator polynomial.

18 Claims, 7 Drawing Sheets

(1) $$e(x) = \sum_{i \in I} e_i x^i + \sum_{j \in J} e_j x^j$$

(2) $$\Lambda(x) = \prod_{i \in I}(1 - \alpha^i x)$$

(3) $$\Psi(x) = \prod_{j \in J}(1 - \alpha^j x)$$

(4) $$U_i = u(\alpha^i) = \sum_{j=0}^{n-1} u_j \alpha^{ij} \quad \text{for } i=0,1,\ldots,n-1$$

(5) $$u_j = U(\alpha^{-j}) = \sum_{i=0}^{n-1} U_i \alpha^{-ji} \quad \text{for } j=0,1,\ldots,n-1$$

(6) $$(U * W)_i = \sum_{j=0}^{n-1} U_j W_{(i-j) \bmod n} \quad \text{for } i=0,1,\ldots,n-1$$

(7) $$(E * \Psi)_i = \sum_{j=0}^{\rho} \Psi_j E_{i-j} = \sum_{j=0}^{\rho} \Psi_j S_{i-j} \quad \text{for } i= \rho+1,\ldots,2t$$

(8) $$\Lambda_0 S'_i + \Lambda_1 S'_{i-1} + \ldots + \Lambda_v S'_{i-v} = 0 \quad \text{for } i= v+1,\ldots,2t-\rho.$$

(9) $$S_1 = v(\alpha^1) = E_1, \ldots, S_{2t} = v(\alpha^{2t}) = E_{2t}$$

(10) $$\Psi(x) = \prod_{j \in J}(1 - \alpha^j x)$$

(11) $$S'_1 = (E * \Psi)_{\rho+1}, \ldots, S'_{2t-\rho} = (E * \Psi)_{2t}$$

(12) $$\Omega(x) = S(x)\Psi(x)\Lambda(x) \bmod x^{2t}$$

(13) $$S(x) = \sum_{i=1}^{2t} S_i x^{i-1}$$

(14) $$e_i = \frac{\Omega(\alpha^{-i})}{\Lambda'(\alpha^{-i})\Psi(\alpha^{-i})}, i \in I$$

(15) $$e_j = \frac{\Omega(\alpha^{-j})}{\Lambda'(\alpha^{-j})\Psi(\alpha^{-j})}, j \in J$$

FIG. 1

(16) $\Psi(x) = \prod_{j\in[\theta]}(1-\alpha^j x)$

(17) $\Psi_0^{(k)} + \Psi_1^{(k)}x + \ldots + \Psi_{2t}^{(k)}x^{2t} = \Psi^{(k)}(x) = \prod_{j\in[\theta^{(k)}]}(1-\alpha^j x)$

(18) $\Psi^{(k+1)}(x) = \prod_{j\in[\theta^{(k+1)}]}(1-\alpha^j x) = \prod_{j\in[\theta^{(k)}]}(1-\alpha^{j+1}x) = \Psi^{(k)}(\alpha x) = \Psi_0^{(k)} + \Psi_1^{(k)}\alpha x + \ldots + \Psi_i^{(k)}\alpha^i x^i + \ldots + \Psi_{2t}^{(k)}\alpha^{2t}x^{2t}$

(19) $\Psi^{(k+1)}(x) = \prod_{j\in[\theta^{(k+1)}]}(1-\alpha^j x) = (1-\alpha^0 x)\prod_{j\in[\theta^{(k)}]}(1-\alpha^{j+1}x) = (1+x)\Psi^{(k)}(\alpha x)$ $= (1+x)(\Psi_0^{(k)} + \Psi_1^{(k)}\alpha x + \ldots + \Psi_i^{(k)}\alpha^i x^i + \ldots + \Psi_{2t}^{(k)}\alpha^{2t}x^{2t})$ $= \Psi_0^{(k)} + (\Psi_0^{(k)} + \Psi_1^{(k)}\alpha)x + \ldots + (\Psi_{i-1}^{(k)}\alpha^{i-1} + \Psi_i^{(k)}\alpha^i)x^i + \ldots + (\Psi_{2t-1}^{(k)}\alpha^{2t-1} + \Psi_{2t}^{(k)}\alpha^{2t})x^{2t}$

FIG. 5

SCHEME FOR ERASURE LOCATOR POLYNOMIAL CALCULATION IN ERROR-AND-ERASURE DECODER

FIELD OF THE INVENTION

The present invention relates to error-and-erasure decoders generally and, more particularly, to a scheme for erasure locator polynomial calculation in an error-and-erasure decoder.

BACKGROUND OF THE INVENTION

Reed-Solomon (RS) codes are a powerful class of multiple error-correcting codes. RS codes have a wide range of applications, such as optical communications, wireless communications and magnetic recording systems. When applying systematic Reed-Solomon encoding, data is transmitted in codewords that represent a combination of the original data symbols and a number of parity symbols. An RS code that uses 2t parity symbols is commonly correctable to t errors. An RS decoder uses the 2t parity symbols to correct a received message, even if the received message experiences up to t errors during transmission.

In many modern communication systems, RS decoders use extra information along with the received data. A reliability value is calculated for each received data symbol. Received data symbols with very small reliability are called erasures. If a particular data symbol in a received codeword is known to be an erasure, a value of the particular symbol is ignored when the RS decoder attempts to decode the codeword. If $v$ errors and $\rho$ erasures occur during transmission of a codeword, the codeword can be corrected if and only if $v+\rho \leq 2t$. RS decoders that use information about erasures are called error-and-erasure decoders. The error-and-erasure decoding techniques involve the construction of erasure locator polynomials. The erasure locator polynomials accumulate information about all of the erasures for use in the decoding process.

SUMMARY OF THE INVENTION

The present invention concerns a method to generate an erasure locator polynomial in an error-and-erasure decode. The method generally includes the steps of (A) storing a plurality of current values in a plurality of registers at a current one of a plurality of moments, (B) generating a plurality of first values by multiplying each one of the current values by a respective one of a plurality of constants, (C) generating a plurality of second values by gating at least all but one of the first values with a current one of plurality of erasure values of an erasure position vector, (D) generating a plurality of next values by combining each one of the second values with a corresponding one of the first values, (E) loading the next values into the registers in place of the current values at a next one of the moments and (F) generating an output signal carrying the current values at a last of the moments such that the current values form a plurality of coefficients of the erasure locator polynomial.

The objects, features and advantages of the present invention include providing a method and/or apparatus implementing a scheme for erasure locator polynomial calculation in an error-and-erasure decoder that may (i) provide space-efficient implementations, (ii) use constant Galois field multipliers and/or (iii) have a smaller timing delay than conventional implementations.

BRIEF DESCRIPTION OF THE DRAWINGS

These and other objects, features and advantages of the present invention will be apparent from the following detailed description and the appended claims and drawings in which:

FIG. 1 is a first set of formulae;
FIG. 5 is a second set of formulae.

DETAILED DESCRIPTION OF THE PREFERRED EMBODIMENTS

Figure 2:
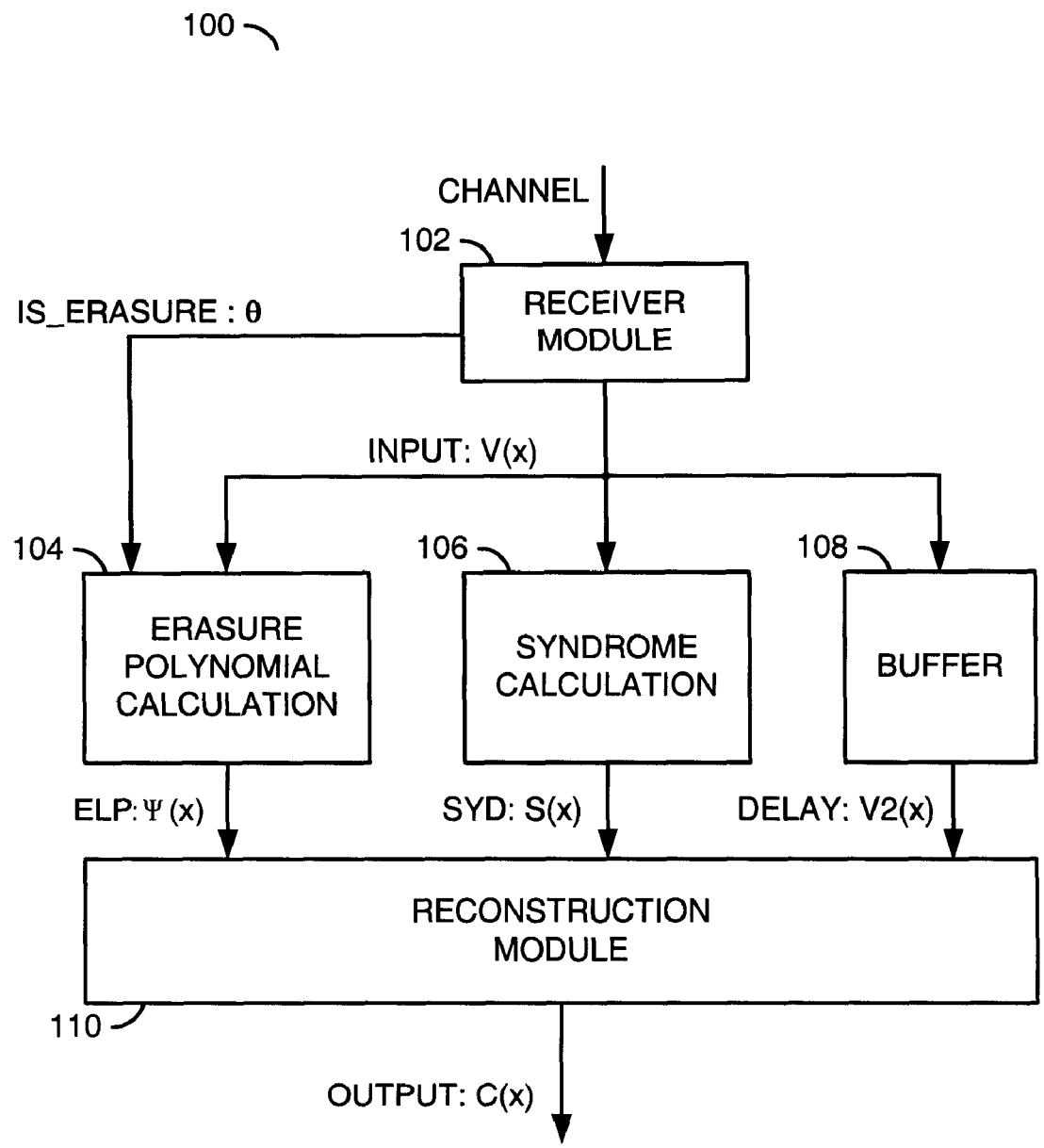
FIG. 2 is a functional flow diagram of a system in accordance with a preferred embodiment of the present invention.

The present invention generally concerns a method and hardware scheme for calculating an erasure locator polynomial. Let $F_q$ be a finite field with $q=2^d$ elements and primitive element $\alpha \in F_q$. Let RS(n,k,t) be a primitive Reed-Solomon code over $F_q$ with $n=q-1$ representing a code length, k representing a number of information symbols and t representing a number of errors. Consider a vector $v=(v_0, \ldots, v_{n-1}) \in F_q^n$ identified with a polynomial $v(x)=v_0+v_1 x + \ldots +v_{n-1}x^{n-1} \in F_q[x]$. By the definition of Reed-Solomon codes, a codeword $c(x)=c_0+c_1 x+ \ldots +c_{n-1}x^{n-1} \in RS(n,k,t)$ if any only if $c(\alpha^1)=c(\alpha^2)=\ldots=c(\alpha^{2t})=0$.

Referring to FIG. 1, a first set of formulae is shown. The original codeword (polynomial) $c(x) \in RS(n,k,t)$ may be sent through a channel that may induce $v$ errors and $\rho$ erasures, where $2v+\rho \leq 2t$. Therefore, a receiving end of the channel may generate the received codeword (polynomial) $v(x)=c(x)+e(x)$, where $e(x)$ is an errata polynomial. The errata polynomial $e(x)$ is generally defined by formula (1), as shown in FIG. 1.

The received codeword $v(x)$ may have a set of $v$ error positions (e.g., $I=\{i_1, \ldots, i_v\}$) that may be unknown at the time of reception. The received codeword $v(x)$ may also have a set of $\rho$ erasure positions (e.g., $J=\{j_1, \ldots, j_\rho\}$) that may be determined ahead of the decoding by the receiver circuitry due to the low reliability of some of the received symbols. An error-and-erasure decoding generally calculates the erasure polynomial $e(x)$ and thus may reconstruct the original codeword as $c(x)=v(x)-e(x)$. In order to determine the set of error positions I, two polynomials may be introduces per the formulae (2) and (3), as shown in FIG. 1. The polynomial $\Lambda(x)$ may be referred to as an error locator polynomial. The polynomial $\Psi(x)$ may be referred to as an erasure locator polynomial.

Note 1: a set $\{0, 1, \ldots, n-1\}$ is generally denoted as $[0,n)$. Furthermore, if $i \in [0,n)$, then (i) $\Lambda(\alpha^{-i})=0$ if and only if $i \in I$ and (ii) $\Psi(\alpha^{-j})=0$ if any only if $j \in J$.

A discrete Fourier transform $F_n: F_q^n \to F_q^n$ generally maps each vector $u=(u_0, \ldots, u_{n-1})$ into a vector $U=(U_0, \ldots, U_{n-1})$ per formula (4), shown in FIG. 1. The map $F_n: F_q^n \to F_q^n$ is commonly a bijection (a transform which is one-to-one and a surjection) and the inverse discrete Fourier transform $u=F_n^{-1}(U)$ may be obtained by formula (5), shown in FIG. 1. The fact that $U=F_n(u)$ and $u=F_n^{-1}(U)$ is generally denoted by $u \xleftrightarrow{F} U$. The maps $F_n$ and $F_n^{-1}$ are commonly linear maps. For example, from $u \overset{F_n}{\longleftrightarrow} U$ and $w \overset{F_n}{\longleftrightarrow} W$, then $au+bw \overset{F_n}{\longleftrightarrow} aU+bW$ generally follows for any $a,b \in F_q$.

Note 2: for two given vectors $u,w \in F_n^q$, (i) the vector $u \cdot w \in F_n^q$, where $(u \cdot w)_i = u_i w_i$, $i=0, \ldots, n-1$, (ii) $F_n(u \cdot w) = U*W$, where $U=F_n(u)$, $W=F_n(w)$ and (iii) $U*W$ may be a convolution, see formula (6) in FIG. 1. Hence, from $u \overset{F_n}{\longleftrightarrow} U$ and $w \overset{F_n}{\longleftrightarrow} W$, then $u \cdot w \overset{F_n}{\longleftrightarrow} U*W$ generally follows.

Let $c \overset{F_n}{\longleftrightarrow} C$, $e \overset{F_n}{\longleftrightarrow} E$, $\lambda \overset{F_n}{\longleftrightarrow} \Lambda$, and $\psi \overset{F_n}{\longleftrightarrow} \Psi$. From note 1, (i) $\lambda_i = \Lambda(\alpha^{-i}) = 0$ generally follows if and only if $i \in I$ and (ii) $\psi_j = \Psi(\alpha^{-j}) = 0$ if and only if $j \in J$. Furthermore, if $e_i \neq 0$, then $i \in I \mathring{A} J$. Therefore, $e \cdot \psi \cdot \lambda = 0$, and also by note 2, $E*\Psi*\Lambda = 0$, where $0 = (0, \ldots, 0) \in F_q^n$. The whole vector E may be unknown, but the 2t components may be obtained. By calculating syndromes $S_i = v(\alpha^i) = V_i = C_i + E_i$ for $i=1, \ldots, 2t$, and using the fact that $C_i = c(\alpha^i) = 0$ for $i=1, \ldots, 2t$, then $E_1 = S_1, \ldots, E_{2t} = S_{2t}$. Thus, 2t subsequent elements of vector E may be known. By the fact that $\deg \Psi(x) = \rho \leq 2t$, the $2t-\rho$ subsequent elements of a vector $E*\Psi$ may be calculated per formula (7), shown in FIG. 1.

Elements $S'_1 = (E*\Psi)_{\rho+1}, \ldots, S'_{2t-\rho} = (E*\Psi)_{2t}$ are commonly known as Forney modified syndromes. By the fact that $\deg \Lambda(x) \leq (2t-\rho)/2$ and the relationship $(E*\Psi)*\Lambda = 0$, the condition in formula (8) may be true, see FIG. 1. Hence, a custom Berlekamp-Massey technique may be used to find the error locator polynomial $\Lambda(x)$ using Forney modified syndromes $S'_1, \ldots, S'_{2t-\rho}$ instead of ordinary syndromes $S_1, \ldots, S_{2t}$.

Once the error locator polynomial $\Lambda(x)$ and the erasure locator polynomial $\Psi(x)$ are known, a set of error and erasure positions may be found using exhaustive search called a Chien search, $I = \{i \in [0,n) | \Lambda(\alpha^{-i}) = 0\}$ and $J = \{i \in [0,n) | \Lambda(\alpha^{-i}) = 0\}$. To reconstruct the errata polynomial $e(x)$, the error and erasure values $e_{i1}, \ldots, e_{iv}$ and $e_{j1}, \ldots, e_{j\rho}$ may be sought.

Referring to FIG. 2, a functional flow diagram of a system 100 is shown in accordance with a preferred embodiment of the present invention. The system (or apparatus) 100 generally implements an error-and-erasure decoder. In some embodiments, the system 100 may implement a Reed-Solomon decoder. The system 100 generally comprises a circuit (or step) 102, a circuit (or step) 104, a circuit (or step) 106, a circuit (or step) 108 and a circuit (or step) 110. A signal (e.g., IS_ERASURE) may be generated by the circuit 102 and transferred to the circuit 104. A signal (e.g., CHANNEL) may be received by the circuit 102. A signal (e.g., INPUT) may be generated by the circuit 102 and presented to the circuit 104, the circuit 106 and the circuit 108. The circuit 110 may generate and present an output signal (e.g., OUTPUT). A signal (e.g., ELP) may be generated by the circuit 104 and presented to the circuit 110. A signal (e.g., SYN) may be generated by the circuit 106 and presented to the circuit 110. The circuit 108 may generate a signal (e.g., DELAY) presented from the circuit 108 to the circuit 110.

The signal IS_ERASURE generally carries an erasure location vector (e.g., $\theta$). The vector $\theta = (\theta_0, \theta_1, \ldots, \theta_{n-1}) \in \{0, 1\}^n$ generally comprises a sequence of binary elements containing information about erasures, where $\theta_j = 1$ indicates an erasure at position $j \in [0,n)$. A set all erasure positions $\{j \in [0,n) | \theta_j = 1\}$ may be denoted by $[\theta]$. The signal INPUT may convey a received codeword (or vector) $v = (v_0, v_1, \ldots, v_{n-1})$. The received codeword $v(x)$ may have been encoded per the Reed-Solomon coding and transmitted through a noisy signal CHANNEL to the circuit 102. The signal ELP may carry an erasure locator polynomial (e.g., $\Psi(x)$). The signal SYN may carry syndromes (e.g., $S(x)$). The signal DELAY may carry a delayed copy (e.g., v2) of the codewords $v(x)$. The signal OUTPUT may convey the reconstructed codeword (or vector) $c(x)$.

The circuit 102 generally implements a receiver. The circuit 102 may be operational to covert a sequence of symbols receive through the signal CHANNEL into the signal IS_ERASURE and the signal INPUT. Generation of the signals IS_ERASURE and INPUT may be performed by common techniques.

The circuit 104 may implement an erasure polynomial calculator. The circuit 104 is generally operational to calculate the polynomial $\Psi(x)$ based on the vector $\theta$ and the codeword $v(x)$. A design of the circuit 104 may utilize constant Galois multipliers to aid in minimizing the circuit size (e.g., number of transistors) and maximize the circuit speed (e.g., reduce propagation delay).

The circuit 106 may implement a syndrome calculator. The circuit 106 is generally operational to calculate the syndromes $S(x)$ from the codeword $v(x)$. The syndrome calculations may be performed by common techniques.

The circuit 108 may implement a buffer. The circuit 108 may hold the codeword $v(x)$ until the circuit 110 is ready to generate the reconstructed codeword $c(x)$. A delay through the circuit 108 may be based on the delays through the circuits 104 and 106 plus a partial delay through the circuit 110.

The circuit 110 may implement a reconstruction circuit. The circuit 110 may be operational to generate the reconstructed codeword C using the polynomial $\Psi(x)$ the syndromes $S(x)$ and the delayed codewords $v2(x)$.

Figure 3:
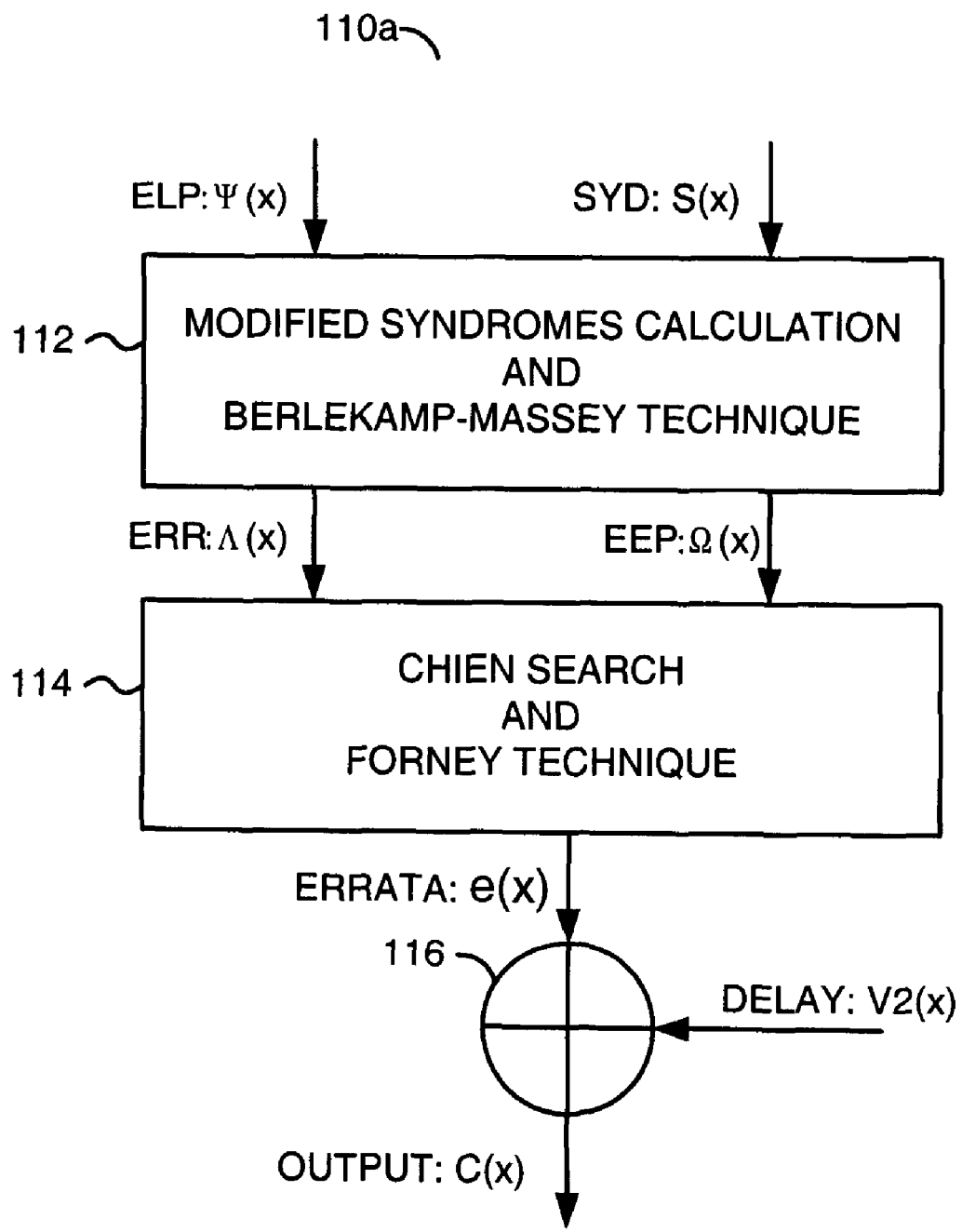
FIG. 3 is a detailed functional flow diagram of a first example embodiment of a reconstruction circuit.

Referring to FIG. 3, a detailed functional flow diagram of a first example embodiment 110a of the circuit 110 is shown. The circuit 110a generally comprises a circuit (or step) 112, a circuit (or step) 114 and a circuit (or step) 116. The polynomial $\Psi(x)$ and the syndromes $S(x)$ may be received by the circuit 112. A signal (e.g., ERR) may be generated by the circuit 112 and presented to the circuit 114. The circuit 112 may also generate a signal (e.g., EEP) presented to the circuit 114. A signal (e.g., ERRATA) may be generated by the circuit 114 and presented to the circuit 116. The circuit 116 may receive the signal ERRATA and the signal DELAY. The signal OUTPUT may be generated by the circuit 116.

The circuit 112 generally implements a calculation circuit. The circuit 112 may be operational to (i) calculate modified syndromes, (ii) generate the signal ERR using the Berlekamp-Massey technique and (iii) generate the signal EEP.

The circuit 114 generally implements a calculation circuit. The circuit 114 may be operational to (i) determine the error positions by the Chien search and (ii) determine the error and erasure values using the Forney technique. The results may be presented in the signal ERRATA.

The circuit 116 may implement a summation circuit. The circuit 116 is generally operational to create the codeword $c(x)$ in the signal OUTPUT by summing the signal ERRATA and the signal DELAY.

In operation, the system 100 may calculate the syndromes $S(x)$ in the circuit 106 in accordance with formula (9), shown in FIG. 1. The circuit 104 may calculate the erasure locator polynomial $\Psi(x)$ in accordance with formula (10), shown in FIG. 1. The circuit 108 generally calculates the modified Forney syndromes (e.g., $S'(x)$) per the formula (11), see FIG. 1.

The circuit 112 may determine the error locator polynomial $\Lambda(x)$ using the Berlekamp-Massey technique on the modified syndromes $S'_1, \ldots, S'_{2t-\rho}$. The errata evaluator polynomial $\Omega(x)$ may be determined by the circuit 112 according to formula (12), where $S(x)$ is a syndrome polynomial in accordance with formula (13), see FIG. 1. The circuit 114 may find the error positions $I = \{i \in [0,n) | \Lambda(\alpha^{-i}) = 0\}$ by a Chien search. The error and erasure values may be determined by the circuit 114 using the Forney formulae (14) and (15), as shown in FIG. 1. Finally, the circuit 116 may calculate the reconstructed codeword c(x)=v(x)+e(x) and present the codeword c(x) in the signal OUTPUT.

Figure 4:
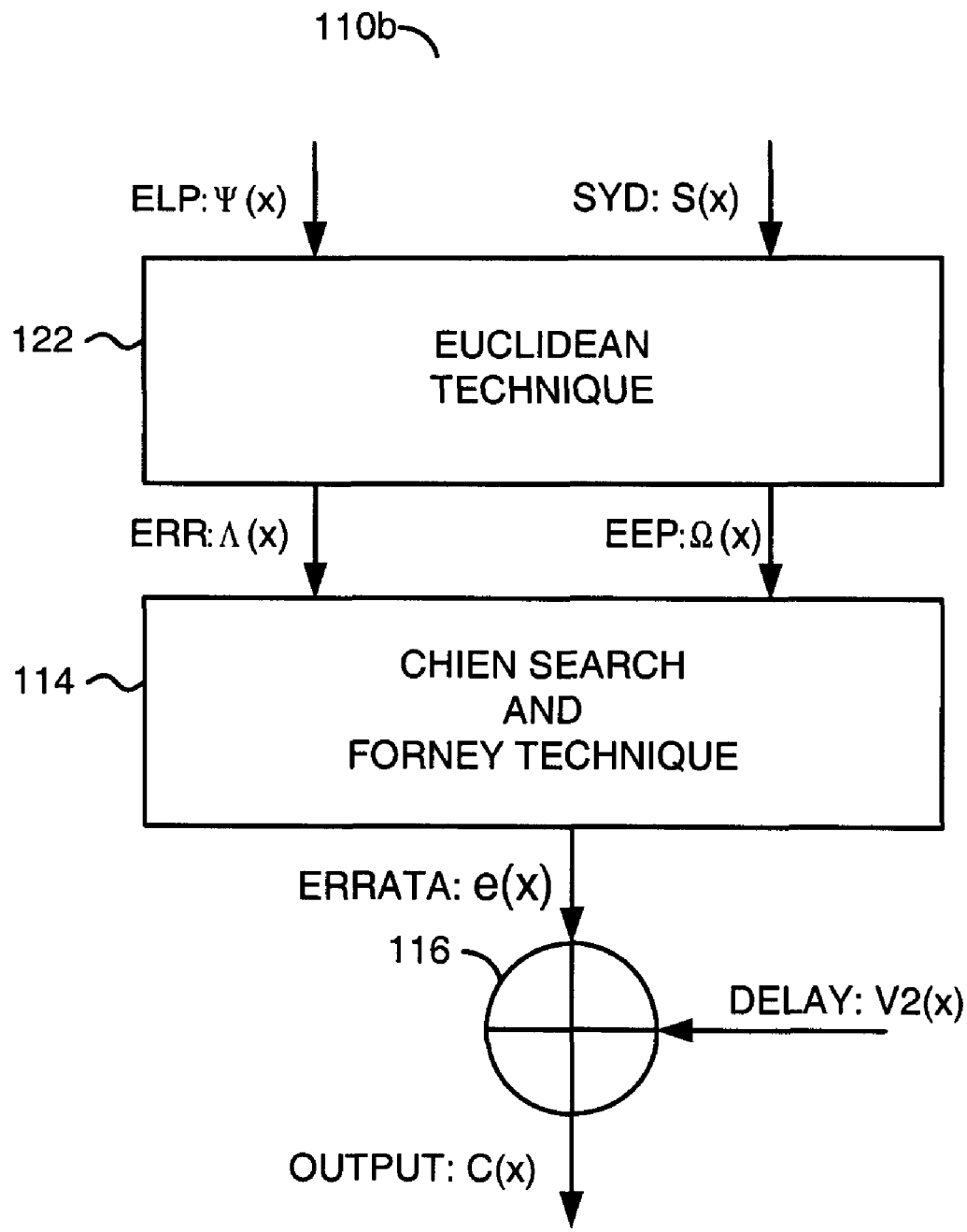
FIG. 4 is a detailed functional flow diagram of a second example embodiment of the reconstruction circuit.

Referring to FIG. 4, a detailed functional flow diagram of a second example embodiment 110b of the circuit 110 is shown. The circuit 110b generally comprises a circuit (or step) 122, the circuit 114 and the circuit 116. The polynomial Ψ(x) and the syndromes S(x) may be received by the circuit 122. The signal ERR may be generated by the circuit 122 and presented to the circuit 114. The circuit 122 may also generate the signal EEP that is presented to the circuit 114. The signal ERRATA may be generated by the circuit 114 and presented to the circuit 116. The circuit 116 may receive the signal ERRATA and the signal DELAY. The signal OUTPUT may be generated by the circuit 116.

The circuit 122 may implement a Euclidian circuit. The circuit 122 is generally operational to calculate the signal ERRATA based on the signal ERR and the signal EEP using the extended Euclidian technique. The remaining circuits 114 and 116 may operate as described above.

Referring again to FIG. 2, the system generally receives (i) the input codeword $v=(v_0, v_1, \ldots, v_{n-1})$ and (ii) the erasure location vector $\theta=(\theta_0, \theta_1, \ldots, \theta_{n-1})\in\{0,1\}^n$ and generates the reconstructed codeword $c=(c_0, c_1, \ldots, c_{n-1})$.

A custom solution for calculating the erasure polynomial Ψ(x) for the vector θ may be in accordance with formula (16), shown in FIG. 5. A hardware scheme for calculating Ψ(x) "on the fly" (e.g., updating the polynomial Ψ(x) as each new element of the vector θ is received) may be implemented in the circuit 104. The circuit 114 may (i) update the polynomial Ψ(x) as new erasures occur and (ii) be implemented using only constant Galois field multipliers. Implementations of constant Galois field multipliers are generally more space efficient on the chips than implementation of non-constant Galois field multipliers. In particular, constant Galois field multipliers may have approximately ten times fewer gates than non-constant Galois field multipliers. Hence, constant multiplier applications may have less complexity, occupy less area and consume less power than a design that uses non-constant multipliers. For implementations of multipliers for Galois field having a large number of elements (e.g., $2^{12}$ elements), the advantages of using constant multipliers may be considerable.

Figure 6:
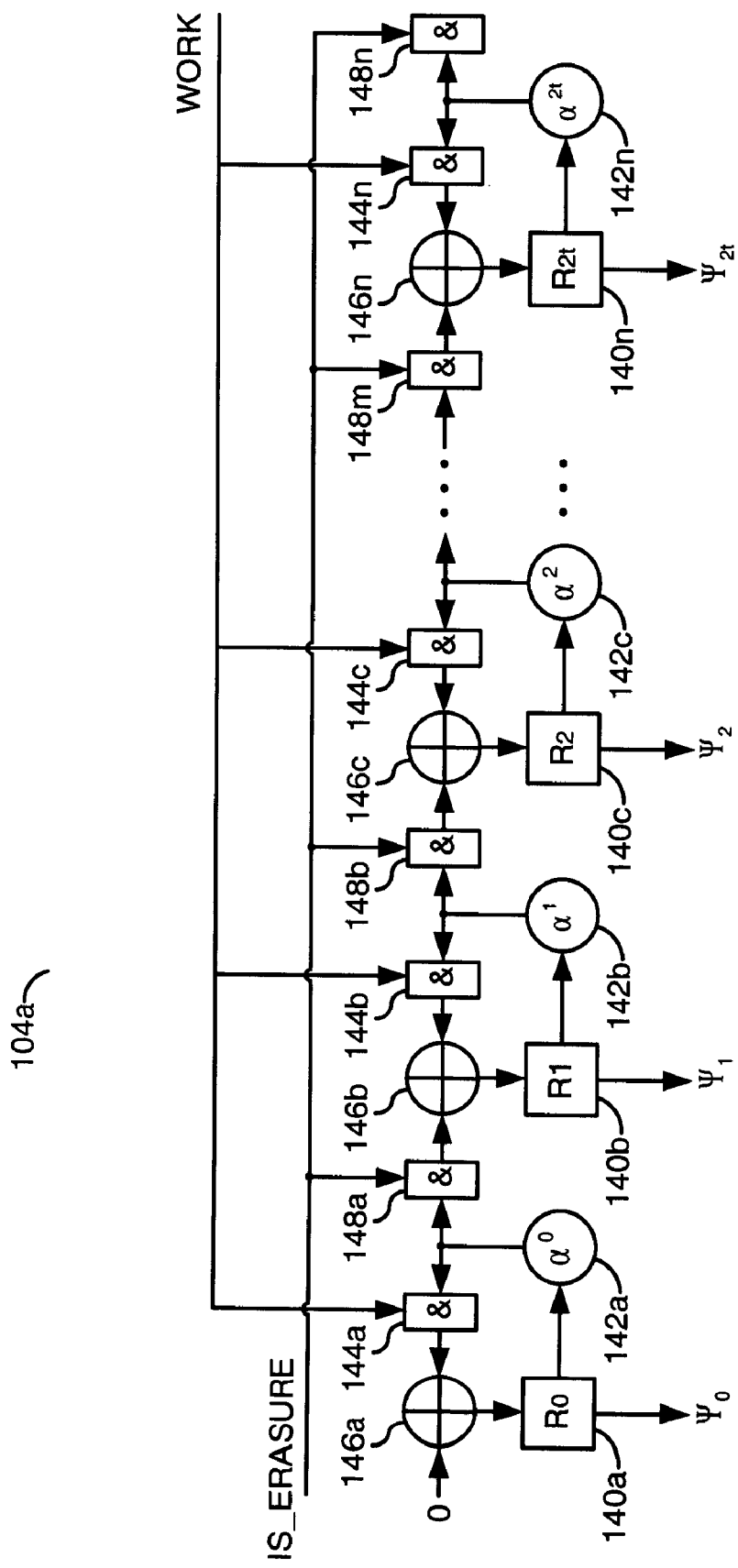
FIG. 6 is a block diagram of a first example embodiment of an erasure polynomial calculator using constant Galois field multipliers.

Referring to FIG. 6, a block diagram of a first example embodiment 104a of the circuit 104 using constant Galois field multipliers is shown. The circuit 104a generally comprises multiple registers (or modules) 140a-140n, several multipliers (or modules) 142a-142n, multiple gating circuits (or modules) 144a-144n, multiple summation circuits (or modules) 146a-146n and multiple gating circuits (or modules) 148a-148n. The signal IS_ERASURE may be received by each of the circuits 148a-148n. A signal (e.g., WORK) may be received by each of the circuits 144a-144n. Each of the registers 140a-140n may generate a portion of the signal ELP (e.g., $\Psi_0, \Psi_1, \ldots, \Psi_{2t}$). The first circuit 146a may (i) receive a first input from the circuit 144a and (ii) a constant value (e.g., 0) as a second input.

The circuit 104a generally contains 2t+1 registers 140a-140n, labeled $R_0, R_1, \ldots, R_{2t}$ and may work as follows. Consider a moment $k\in\{0, \ldots, n-1\}$ when the registers 140a-140n already buffer bits $\theta_{n-1}, \theta_{n-2}, \ldots, \theta_{n-k}$ for $k\in\{1, \ldots, n-1\}$ and the vector $\theta^{(k)}=(\theta_{n-k}, \theta_{n-k+1}, \ldots, \theta_{n-1}, 0, \ldots, 0)\in\{0,1\}^n$, where $\theta^{(0)}=(0, \ldots, 0)\in\{0,1\}^n$. The scheme generally works so that at the moment k, the register $R_i$ may hold a current value of $\Psi_i^{(k)}$, for i=0, 1, \ldots, 2t, where Ψ(x) may be defined by formula (17), shown in FIG. 5. Therefore, the registers 140a-140n may completely define the polynomial $\Psi^{(k)}(x)$ at the moment k. At a final moment (e.g., k=n) when all of the elements of the vectors θ and v have been entered into the circuit 104a, the registers 140a-140n generally contain the coefficients $\Psi_0, \Psi_1, \ldots, \Psi_{2t}$ of erasure locator polynomial Ψ(x) because $\theta^{(n)}=\theta$ and therefore $\Psi^{(n)}(x)=\Psi(x)$. Furthermore, $R_0=\Psi_0^{(k)}=1$ for any k=0, 1, \ldots, n-1. Hence, $R_0$ may be a constant (e.g., $1\in F_q$).

At an initial moment (e.g., k=0), the signal IS_ERASURE may be set to a binary zero value (0) and the signal WORK may be deasserted to the binary zero value. Therefore, the initial values in the registers 140a-140n may be $R_0:=1, R_1:=0, \ldots, R_{2t}:=0$. The initial values generally correspond to the polynomial $\Psi^{(0)}(x)=1$. After the initial moment, the signal WORK may be asserted to a binary one value (1) and the signal IS_ERASURE may be set to $\theta_{n-k}$ at each moment $n\geq k>0$. Thus, at the moment k, the registers 140a-140n may contain $\Psi_0^{(k)}, \Psi_1^{(k)}, \ldots, \Psi_{2t}^{(k)}$.

Each of the registers 140a-140n may present the buffered current values to the corresponding multipliers 142a-142n. Each of the multipliers 142a-142n may perform a unique (e.g., $\alpha^0, \alpha^1, \ldots, \alpha^{2t}$) constant Galois field multiplication to generate first intermediate values. The first intermediate values may be received by the corresponding modules 144a-144n and 148a-148n. Once the signal WORK has been asserted, the modules 144a-144n may pass the first intermediate values unaltered to the circuit 146a-146n, respectively. The circuits 148a-148n may selectively gate the first intermediate values with the signal IS_ERASURE to generate second intermediate values. The second intermediate values may provide a second input to the circuits 146b-146n.

Each of the circuits 142a-142 generally has a single input $X=(X_1, \ldots, X_d)$ and a single output $Y=(Y_1, \ldots, Y_d)$. Each $\alpha^i$ for i=0, \ldots, 2t, may be a constant Galois field multiplier, where α is known Galois field element. The output may be related to the input by Y=α*X in the Galois field.

Each of the circuits 144a-144n and 148a generally has two inputs. A first input may be a 1-bit input (e.g., W) connected to the signal IS_ERASURE or the signal WORK. A second input may be a d-bit input connected to an output signal (e.g., $X=(X_1, \ldots, X_d)$), where d is generally the width of the Galois field (e.g., the Galois field may have $2^d$ elements). Each of the circuits 144a-144n and 148a-148n may generate a single d-bit output (e.g., $Z=(Z_1, \ldots, Z_d)$). A function of the circuits 144a-144n and 148a-148n may be expressed as $Z_1$=W AND $X_1$, $Z_2$=W AND $X_2$, \ldots, $Z_d$=W AND $X_d$.

Each of the circuits 146a-146n generally has two inputs. Each Galois field element a∈Fq, where $q=2^d$, may be represented as binary vector (e.g., $a_1, a_2, \ldots, a_d$). Likewise, another Galois field element b∈Fq may be represented as $(b_1, b_2, \ldots, b_d)$. The circuits 146a-146 generally calculates the sum a+b in the Galois field arithmetic as another Galois field element represented as $(a_1 \text{ XOR } b_1, \ldots, a_d \text{ XOR } b_d)$.

Consider the following two cases to prove that at the moment k+1 the registers 140a-140n may contain $\Psi_0^{(k+1)}, \Psi_1^{(k+1)}, \ldots, \Psi_{2t}^{(k+1)}$. In a first case, let no erasure exist at the position k+1, (e.g., $\theta_{n+k-1}=0$). Therefore, $\theta^{(k+1)}=(0, \theta_{n-k}, \theta_{n-k+1}, \ldots, \theta_{n-1}, 0, \ldots, 0)$. As such, the vector $\theta^{(k+1)}$ is generally a "right shift" of the vector $\theta^{(k)}$ and the polynomial $\Psi^{(k+1)}(x)$ may be defined by formula (18), shown in FIG. 5. In the first case, $R_i:=R_i\alpha^i$ for i=1, \ldots, 2t.

In a second case, let an erasure exist at the position k+1, (e.g., $\theta_{n+k-1}=1$). Therefore, $\theta^{(k+1)}=(1, \theta_{n-k}, \theta_{n-k+1}, \ldots, \theta_{n-1}, 0, \ldots, 0)$ and the polynomial $\Psi^{(k+1)}(x)$ may be defined by formula (19), shown in FIG. 5. In the second case, $R_i:=R_{i-1}\alpha^{i-1}+R_i\alpha^i$ for i=1, \ldots, 2t.

Figure 7:
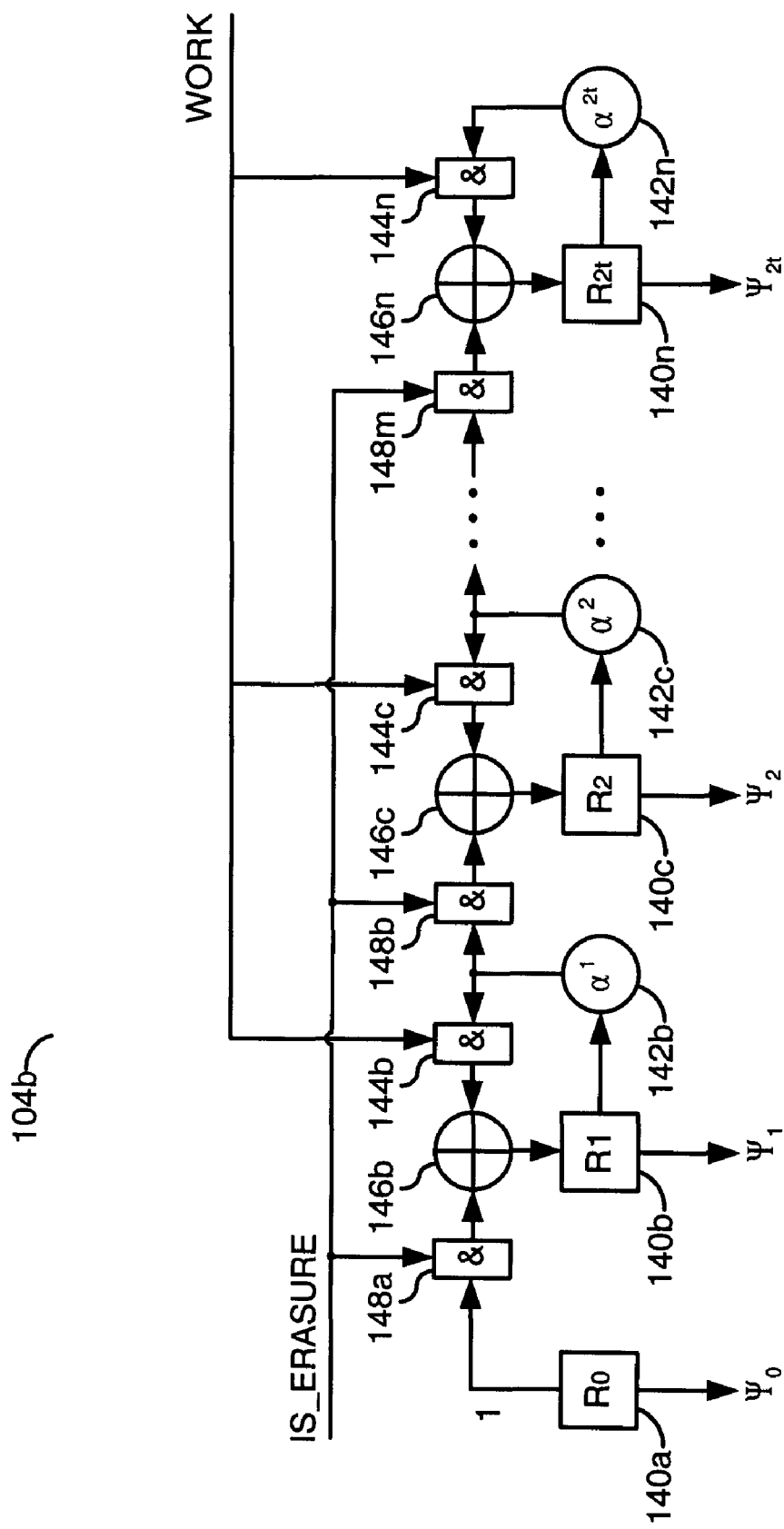
FIG. 7 is a block diagram of a second example embodiment of the erasure polynomial calculator.

Referring to FIG. 7, a block diagram of a second example embodiment 104b of the circuit 104 is shown. The circuit 104b may be similar to the circuit 104a with a few modifications. Consider that the register 140a stores a constant value (e.g., 1) and the circuit 142a is a multiplication by one (e.g., $\alpha^0=1$). Therefore, the circuits 142a, 144a and 146a may be eliminated in the circuit 104b and the current value of the register 140a may be presented directly to the input of the circuit 148a. Furthermore, a last of the circuits 148n may be eliminated as the corresponding signal generally does not feed into a next summation module. With the eliminations, the circuit 104b generally operates the same as the circuit 104a (and the circuit 104).

The functions performed by the diagrams of FIGS. 1-7 may be implemented using a conventional general purpose digital computer programmed according to the teachings of the present specification, as will be apparent to those skilled in the relevant art(s). Appropriate software coding can readily be prepared by skilled programmers based on the teachings of the present disclosure, as will also be apparent to those skilled in the relevant art(s).

The present invention may also be implemented by the preparation of ASICs, FPGAs, or by interconnecting an appropriate network of conventional component circuits, as is described herein, modifications of which will be readily apparent to those skilled in the art(s).

The present invention thus may also include a computer product which may be a storage medium including instructions which can be used to program a computer to perform a process in accordance with the present invention. The storage medium can include, but is not limited to, any type of disk including floppy disk, optical disk, CD-ROM, magneto-optical disks, ROMs, RAMs, EPROMs, EEPROMs, Flash memory, magnetic or optical cards, or any type of media suitable for storing electronic instructions.

While the invention has been particularly shown and described with reference to the preferred embodiments thereof, it will be understood by those skilled in the art that various changes in form and details may be made without departing from the scope of the invention.

The invention claimed is:

1. A method to generate an erasure locator polynomial in an error-and-erasure decoder, comprising the steps of:
   (A) storing a plurality of current values in a plurality of registers;
   (B) generating a plurality of first values by multiplying each one of said current values by a respective one of a plurality of constants;
   (C) generating a plurality of second values by gating at least all but one of said first values with a current one of a plurality of erasure values of an erasure location vector;
   (D) generating a plurality of next values by combining each one of said second values with a corresponding one of said first values;
   (E) loading said next values into said registers in place of said current values; and
   (F) generating an output signal carrying said current values such that said current values form a plurality of coefficients of said erasure locator polynomial.

2. The method according to claim 1, wherein said constants comprise a plurality of constant Galois field multipliers.

3. The method according to claim 1, further comprising the step of:
   initializing said current values with a binary one value in a first of said registers and a binary zero value in each of a remainder of said registers.

4. The method according to claim 1, wherein an initial value of said erasure values of said erasure location vector comprises a binary zero value at an initial moment such that all of said second values are generated as said binary zero value at said initial moment.

5. The method according to claim 1, further comprising the step of:
   gating said first values under control of a work signal prior to combining with said second values, wherein said work signal is (i) deasserted at an initial one of a plurality of moments such that each of said first values as gated comprises a binary zero value and (ii) asserted at a remainder of said moments such that said first values are unaltered by said gating.

6. The method according to claim 1, wherein combining each one of said second values with said corresponding one of said first values comprises summing in Galois field arithmetic.

7. The method according to claim 1, wherein
   said error-and-erasure decoder comprises a Reed-Solomon decoder.

8. The method according to claim 1, wherein (i) said current values are stored at a current one of a plurality of moments, (ii) said next values are loaded at a next one of said moments and (iii) said output signal is generated at a last of said moments.

9. A circuit comprising:
   a plurality of registers (i) storing a plurality of current values and (ii) generating an output signal carrying said current values such that said current values form a plurality of coefficients of an erasure locator polynomial in an error-and-erasure decoder;
   a plurality of multiplier modules generating a plurality of first values by multiplying each one of said current values by a respective one of a plurality of constants;
   a plurality of first modules generating a plurality of second values by gating at least all but one of said first values with a current one of plurality of erasure elements of an erasure location vector; and
   a plurality of summing modules (i) generating a plurality of next values by combining each one of said second values with a corresponding one of said first values and (ii) loading said next values into said registers in place of said current values.

10. The circuit according to claim 9, wherein said constants comprise a plurality of constant Galois field multipliers.

11. The circuit according to claim 9, wherein said current values are initialized with a binary one value in a first of said registers and a binary zero value in each of a remainder of said registers.

12. The circuit according to claim 9, wherein an initial value of said erasure values of said erasure location vector comprises a binary zero value at an initial moment such that all of said second values are generated as said binary zero value at said initial moment.

13. The circuit according to claim 9, further comprising a plurality of second modules (i) disposed between said multiplier modules and said summing modules and (ii) gating said first values under control of a work signal prior to combining with said second values, wherein said work signal is (a) deasserted at an initial one of a plurality of moments such that each of said first values as gated comprises a binary zero value and (b) asserted at a remainder of said moments such that said first values are unaltered by said second modules.

14. The circuit according to claim 9, wherein combining each one of said second values with said corresponding one of said first values comprises summing in Galois field arithmetic.

15. The circuit according to claim 9, wherein said error-and-erasure decoder comprises a Reed-Solomon decoder.

16. A system comprising:
a first circuit configured to generate an erasure locator polynomial in response to all of (a) an erasure location vector and (b) a plurality of constants, wherein each of said constants is a multiplication factor in a respective one of a plurality of multiplier modules;
a second circuit configured to generate a plurality of syndromes in response to an input codeword; and
a third circuit configured to generate an output signal carrying a reconstructed codeword in response to all of (i) said erasure locator polynomial, (ii) said syndromes and (iii) said input codeword, wherein (a) said first circuit comprises a plurality of registers configured to (i) store a plurality of current values and (ii) generate an intermediate signal carrying said current values such that said current values form a plurality of coefficients of said erasure locator polynomial, (b) said multiplier modules are configured to generate a plurality of first values by multiplying said current values by said respective constants and (c) said first circuit further comprises a plurality of first modules configured to generate a plurality of second values by gating at least all but one of said first values with a current one of plurality of erasure values of said erasure location vector.

17. The system according to claim 16, wherein said first circuit further comprises a plurality of summing modules configured to (i) generate a plurality of next values by combining each one of said second values with a corresponding one of said first values and (ii) load said next values into said registers in place of said current values.

18. The system according to claim 17, wherein said first circuit further comprises a plurality of second modules (i) disposed between said multiplier modules and said summing modules and (ii) configured to gate said first values under control of a work signal prior to combining with said second values, wherein said work signal is (a) deasserted at an initial one of a plurality of moments such that each of said first values as gated comprises a binary zero value and (b) asserted at a remainder of said moments such that said first values are unaltered by said second modules.

* * * * *